United States Patent [19]

Ragard et al.

[11] 4,270,651
[45] Jun. 2, 1981

[54] TAPED BELT ELECTRONIC COMPONENT CENTERING DEVICE

[75] Inventors: Phillip A. Ragard; Frank J. Orzelek, both of Binghamton, N.Y.

[73] Assignee: Universal Instruments Corporation, Binghamton, N.Y.

[21] Appl. No.: 4,214

[22] Filed: Jan. 17, 1979

[51] Int. Cl.³ ............................................. B65G 47/26
[52] U.S. Cl. ..................................... 198/456; 198/345
[58] Field of Search ...................... 198/456, 434, 345; 294/116

[56] References Cited

U.S. PATENT DOCUMENTS

| 3,149,714 | 9/1964 | Williams et al. | 294/116 X |
| 3,225,890 | 12/1965 | Wiese | 198/456 |
| 4,021,292 | 5/1977 | Bates et al. | 198/456 X |

Primary Examiner—Robert B. Reeves
Assistant Examiner—Douglas D. Watts
Attorney, Agent, or Firm—Fidelman, Wolffe & Waldron

[57] ABSTRACT

In a centering device for electronic components equally spaced and traveling on a continuous conveyor, an actuator provided including a pair of pivoting, spring-loaded blades for positioning the bodies of the components before they are transferred from the continuous conveyor into a taping mechanism.

3 Claims, 5 Drawing Figures

TAPED BELT ELECTRONIC COMPONENT CENTERING DEVICE

CROSS REFERENCES TO RELATED ART

This application is an improvement of U.S. Pat. No. 4,021,292, issued May 3, 1977 to Erwin Frederick Bates and Roy Marvin Whiting.

BACKGROUND OF THE INVENTION

The use of belted electronic components (resistors, disc capacitors, diodes, etc.) has become in recent years one of the most convenient handling techniques for the electronics industry. The leads of components are pre-straightened and generally aligned and equally spaced on the belt so that they may be fed directly into insertion machines or testing devices without intermediate handling. However, the speed and efficiency of subsequent operations using belted tapes is reduced and complexity is increased when the components are not precentered on the taped belt.

U.S. Pat. No. 4,021,292 discloses a taped belt electronic component centering device in which spring-loaded fingers center electronic components that are being fed by a conveyor to a component taping means, and the component opens the centering fingers. A problem sometimes arises when components having delicate leads and/or small diameter bodies engage these centering fingers. To wit, the spring closing force of these fingers is strong enough to either bend some of the leads or the body rides up on the fingers and thus is not centered by them.

SUMMARY OF THE INVENTION

It is an object of the present invention to provide a novel means for actuating the centering fingers of an electronic component feeding and taping machine. More specifically, a rotating cam surface is used to open and control the rate of closure of centering fingers in timed relation with the feeding of the components to the fingers, in order to prevent bending delicate leads while providing the centering function.

Specifically provided by the present invention are actuating means which open guide blades in timed relation with the feeding of components, the timed relation being provided by a flexible drive shaft in conjunction with a timing disc.

BRIEF DESCRIPTION OF THE DRAWINGS

In the drawings:

Referring to FIGS. 1 and 2, the electronic component centering device is illustrated in relationship to the electronic component taping mechanism 16, with all parts not specific to the centering device shown in phantom lines. These figures illustrate the positional relationship of the centering device with respect to the taping mechanism 16, in which electronic components, generally shown as 14, are carried by a conveyor 12 into contact with the centering device 20.

FIG. 3A depicts the guide blades 76 of the centering device 20 opened by the cam 151 and an electronic component 14, which is off-center with respect to center line 124, just prior to closing of fingers 76 onto the body 122 of component 14. FIG. 3B depicts the guide blades of the centering device 20 just after closing of fingers 76 onto the body 122 of component 14 with the body 122 centered with respect to center line 124.

FIG. 4 illustrates the underside of the centering device 20 and discloses cooperating, short radial cams 92 in frictional contact with each other such that arms 92 pivot in unison against the biasing of springs 98 and 100, spring 98 tending to close blades 76 and spring 100 tending to open blades 76. Mechanical stop 102, in the form of a pin engages one of the arms 92 and limits the closing of blades 76. Screw knob 162 is for hand adjustment of clamp 160 which attaches centering device 20 to an extension 106 of the main structure 107 of taping mechanism 16 (as best seen in FIG. 1). Cam 151 may be seen in phantom lines on the top side of the centering device main body 86.

Additional elements and functions of the feeding and taping mechanism 16 are known in the art and, therefore, are not described in this disclosure; and these additional elements are omitted from the drawings for the sake of clarity. Among the omitted elements are the electronic component feed and sequencing mechanisms which automatically positioned electronic components 14 onto moving conveyor 12 in any desired sequence and mixture, with component leads 26 aligned and cut to proper length prior to conveyance of the components 14 to taping mechanism 16. Also among the functions and elements omitted from this specification is a detailed description of the control and memory systems which govern such functions as starting and stopping; rates of component feed; conveyor speed; and spacing, sequencing, and mixing of components. All of these functions and elements known in the art are exemplified in U.S. Pat. No. 3,421,284 to which the novel mechanism of this disclosure may be readily adapted.

DETAILED DESCRIPTION OF THE INVENTION

Figure 1:
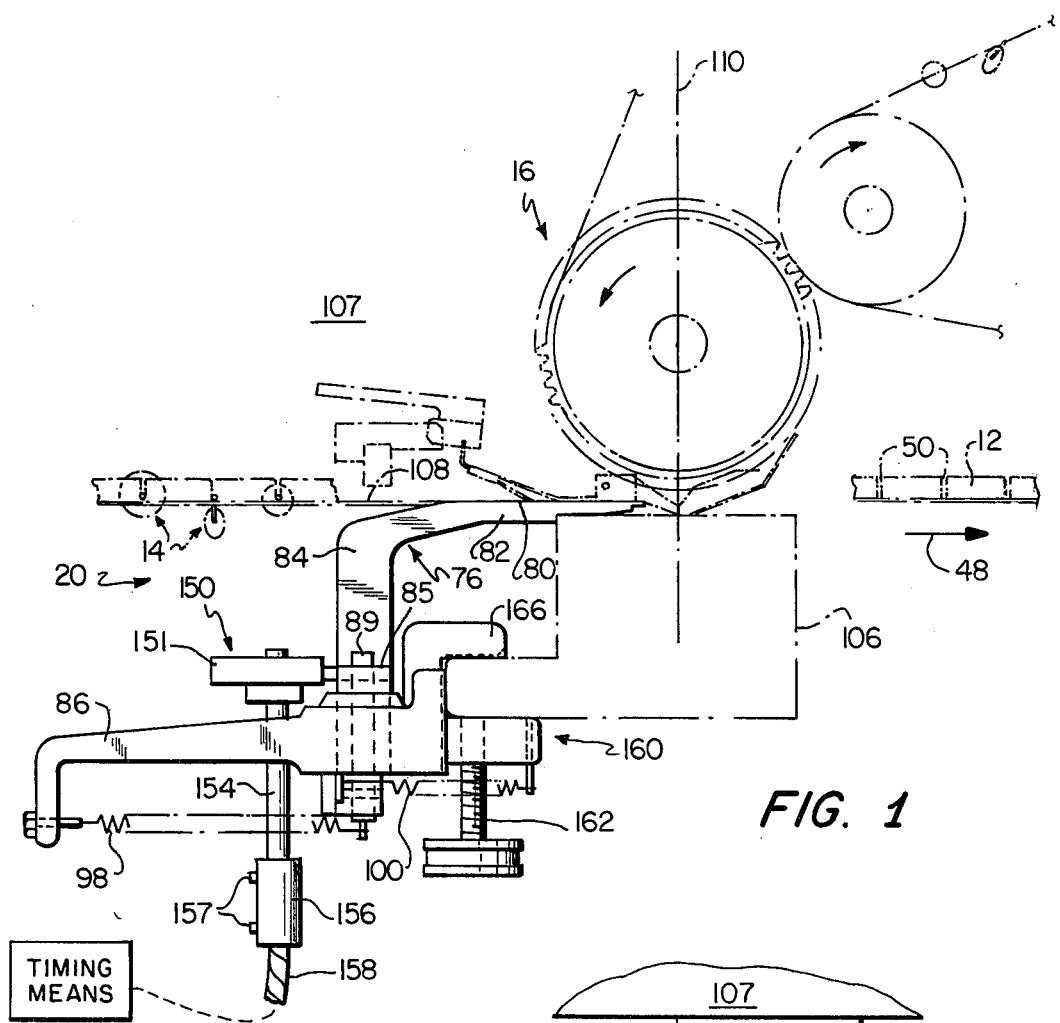
FIG. 1 is a front elevational view, with parts omitted, of portions of the centering and taping mechanism.
Figure 2:
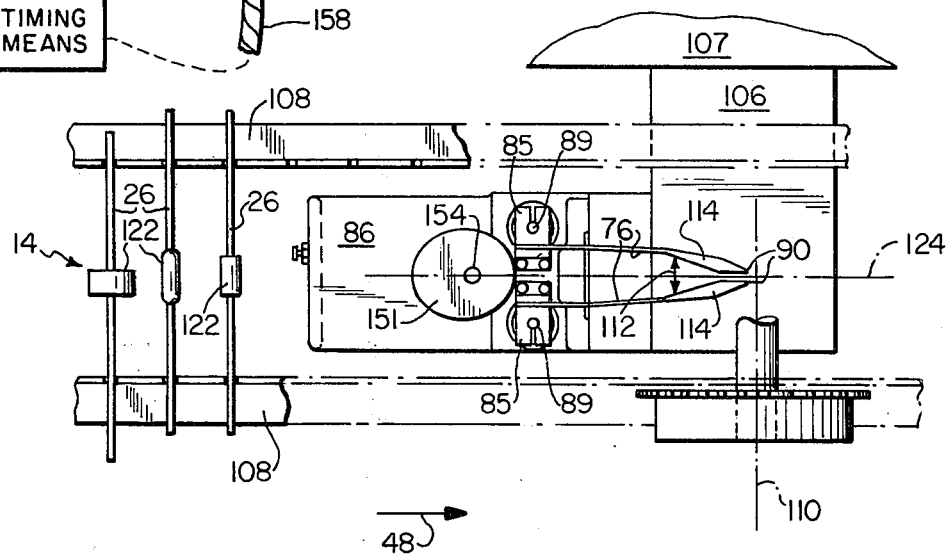
FIG. 2 is a plan view, with parts omitted, of the centering mechanism of FIG. 1.

Referring particularly to FIGS. 1 and 2, the conveyor 12 includes a pair of spaced apart endless L-shaped belts 42 which are driven by motive means (not shown) in the direction generally indicated by the arrow 48. The L-shaped conveyor belts 42 are formed with spaced pairs of opposed slots 50 which are adapted to removably receive wire leads 26 of electronic components 14, such that the longitudinal axes of the leads 26 lie generally transverse to the direction of travel 48 of the conveyor 12.

Synchronizing means, now shown, control the relationship between the linear motion of the conveyor 12 and the rotational motion of taping heads of a taping mechanism generally indicated at 16 such that the taping head slots 74 engage the leads 26 of the electronic components 14 as they are lifted by the lifting guides 24 from their resting place on top surfaces 80 of blades 76 and in the slots 50 of the moving conveyor 12 as explained hereinafter.

Figure 4:
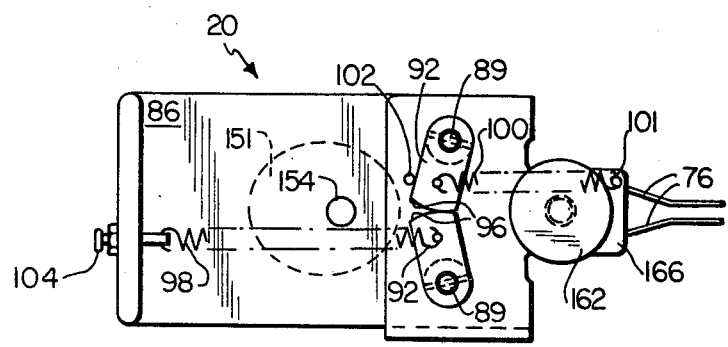
FIG. 4 is a bottom view of the centering device of FIG. 1.

The centering guide assembly 20 (FIG. 2) is comprised of a pair of generally L-shaped guide blades 76, positioned approximately equidistant between the L-shaped conveyor belts 42. The L-shaped guide blades 76 are oriented (FIG. 1) with the longer legs 82 generally horizontal and the shorter legs 84 depending vertically therefrom. The vertical legs 84 bend outward at the lower end to form horizontal flanges 85 which pivot on support member 86 by means of vertical pins 89 rigidly attached to the flanges 85 and located such that there is symmetry of the guide blades 76 between the conveyor belts 42 as seen in the plan view (FIG. 2). Tips 114 of the guide blades 76 extend from the pivots in the direction 48 of conveyor motion and are able to swing apart, pivoting on the pins 89. The pivot pins 89 extend below the support member 86 where (FIG. 4) short radial arms 92 fixedly attached, extend equally, one from each pivot pin 89. The outer edges 96 of the arms have equal circular curvatures and the arm lengths are such that there is rolling contact between the arms 92 when the guide blades 76 swing from their most closed to their most separated positions. Interlocked ridges, or teeth (not shown), on the outer edges 96 of the arms prevents slippage between the arms 92, so that the swinging motion of the two blades 76 is always equal in magnitude and in opposite directions, i.e., the blades swing inwardly or apart in unison.

A bias spring 98, connected between one pivoted arm 92 and the support member 86, is tensioned to draw the blades 76 together in opposition to the action of cam 151. A weaker bias spring 100 connected between the other pivoted arm and the support member 86, via a pin 101, is tensioned to cause the blades 76 to separate. Thus, the net force exerted by the stronger spring 98 causes the guide blades to be at the closest position when they are not opened by the cam 151. Contact between the blades 76 is prevented by a mechanical stop 102 fixed to the support member 86 which limits the travel of one of the pivoted arms 92. Tension in the stronger spring 98 is varied by means of an adjusting screw 104 such that the force required to spread the guide blades 76 apart may be maintained as required, e.g., when a spring is replaced.

The juxtaposed guide blades 76 bend inwardly toward each other (FIG. 2) providing a gradual reduction (diminishing in the direction of conveyor travel 48) in the space 112 between them. A bend in the blades 76 near the free ends provides tips 114 which extend back from the blade ends approximately one-third the length of the blades 76.

The support member 86 and thus the fixedly attached centering guide assembly 20 is rigidly fastened in any suitable manner, e.g., clamp 160, to an extension 106 from the main structure 107 of the taping mechanism 16 so that the upper edges and surfaces 80 of the blades 76 are generally horizontal and substantially coplanar with the horizontal elements 108 of the L-shaped conveyor belts 42; and the free ends 90 of the guide blades 76 extend approximately to the projected vertical centerlines 110 of the taping heads 40. All electronic components 14 moving with the conveyor 12 pass the centering guide assembly 20 prior to reaching the taping heads 40.

When an electronic component 14 is carried between the L-shaped belts 42 with the leads 26 resting in a pair of opposed conveyor slots 50, a portion of the body 122 of the component 14 extends (FIG. 1) below the level of the upper surfaces 80 of the centering blades 76. Then that depending portion of the component 14 will be contacted by the centering blades 76 as the component 14 moves on the conveyor 12.

When a component 14 is centered between the L-shaped belts 42, contact is made substantially simultaneously with both centering blades 76. However, when the component 14 is off center between the L-shaped belts 42, contact will be made first with one centering blade, e.g., the lower blade when the component is below center (as viewed in FIG. 3A) by which the moving component 14 is forced toward the centerline 124 of the pair of blades 76 by reaction of the finger 114 of that blade against the depending body 122 of the component 14. After the component 14 is centered, continuous component contact is made with both centering blades 76 and as the conveyor 12 progresses, the component 14 is centered and passes between blades 76. It should be noted that an axial leaded component 14, such as a resistor, is 'centered' when the resistor body 118 is centered transversely over the centerline 124 of the blades 76.

In operation of the centering device of the invention, the actuating means 150 is the novel portion of the centering device 20 of this invention and comprises a rotating cam 151 for opening and controlling the rate of closure of fingers 76 in opposition to spring 98 of the centering device 20 of U.S. Pat. No. 4,021,292; a cam securing means 162 for securing cam 151 to rotatably driven support rod 154; a driving means such as a flexible drive shaft 158; and a means such as a tubular connector 156 with set screws 157 for securing drive shft 158 to support rod 154.

Figure 3A:
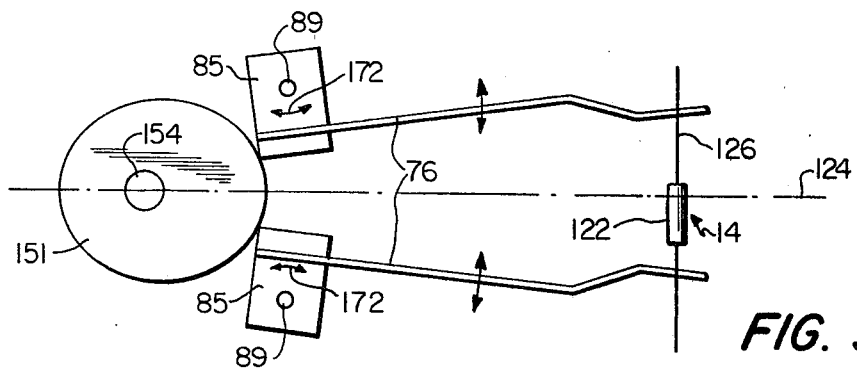
FIGS. 3A and 3B illustrate the open and closed positions of the fingers of the centering mechanism and their relationship to an electronic component.
Figure 3B:
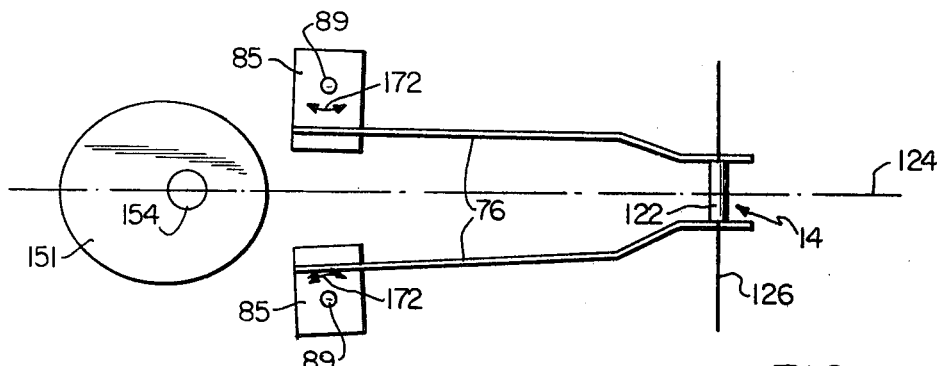

Cam 151 is rotated in timed relation with the feed of components 14 and abuts pivotal flanges 85 of guide blades 76 to open guide blades 76 as the components 14 are fed to guide blade tips 114. As a component 14 approaches tips 114, the guide blades 76 smoothly close into contact with the component body 122 due to the cam actuator and spring 98. As best seen in FIGS. 3A and 3B, a component body 122 that is not centered with respect to center line 124 prior to contact by tips 114 will be centered by the tips 114 closing upon the component; and as the conveyor 12 continues to feed the component 14 past tips 114 to the taping mechanism 16, cam 151 will again open guide fingers 76 into position for receiving the next component.

A hold-down assembly 22, (FIG. 1) acts upon the centered component 14 prior to release of the component by the centering blades 76.

When no component 14 is passing through the centering blades 76, fingers 126 of hold-down assembly 20 depend below the level of the upper surfaces 80, of the blades 76. As components 14 moving in turn on the conveyor 12 near the free ends 90 of the centering blades 76, the fingers 126 rest in turn on bodies 122 of the successive components. Free pivoting of the fingers 126 allows the fingers 126 to rise up to conform with the contours of the centered component body passing beneath. The weight of the fingers 126 on the component bodies 122 assures that the components in turn remain centered after emerging from between the centering blades 76 and until engaged by lifting guides 24. Depending components 14, centered by the centering blades 76 are retained by the fingers 126 in the centered position.

A depressor blade (not shown) presses down upon components 14 as they move between the centering blades 76 and prevents the components from riding up and over the blades 76 as they might otherwise tend to do because of the force of the spring-loaded centering blade 76.

The positional relationship between the ends 90 of the centering blade 76, the hold-down fingers 126, the conveyor 12 and taping heads 40 are such that a component 14 centered by the centering blades 76 is restrained in position by the hold-down fingers 126 before contact between component 14 and centering blades 76 as they are fed to taping mechanism 16.

What is claimed is:

1. In an electronic component centering and guiding device for centering components on a conveyor, said centering device including a support base and a pair of juxtaposed, elongated blades suitable to be centered with respect to said conveyor and oriented in the direction of travel of said components on said conveyor, means for pivotally attaching a first end of each of said blades to said base the other end of said blades swingable apart in unison and in symmetric motion in opposition to means for biasing said blades into contact with a component, whereby said blades center said component by translating said component transversely to said direction of travel of said component, the improvement comprising: a driven rotatable cam for opening said blades before reception and pass-through of said components and for controlling the rate of closure of said blades onto said component and reopening during pass-through, said cam contacting at least one of said first ends of said blades.

2. An electronic component centering device according to claim 1, in which said driven cam abuts said first end of each of said blades, a support rod journaled in said base of said centering device and having a first end and a second end, said first end of said support rod removably attached to said cam, said second end removably attached to a flexible drive shaft by a connector, said cam rotatable in timed relation to said conveyor by a timing means through said flexible drive shaft.

3. An electronic component centering device according to claim 1, in which said means for opening and controlling the rate of closure of said blades is actuatable in timed relation to said conveyor.

* * * * *